(12) United States Patent
Moritoki et al.

(10) Patent No.: US 7,646,096 B2
(45) Date of Patent: Jan. 12, 2010

(54) SEMICONDUCTOR DEVICE AND MANUFACTURING METHOD THEREOF

(75) Inventors: Masashige Moritoki, Kanagawa (JP); Kouichi Konishi, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 39 days.

(21) Appl. No.: 11/235,309

(22) Filed: Sep. 27, 2005

(65) Prior Publication Data
US 2006/0065979 A1    Mar. 30, 2006

(30) Foreign Application Priority Data
Sep. 29, 2004  (JP)  .............................. 2004-283606

(51) Int. Cl.
H01L 23/48   (2006.01)
H01L 23/52   (2006.01)
H01L 29/40   (2006.01)
H01L 21/44   (2006.01)

(52) U.S. Cl. .............................. 257/758; 257/E21.577; 438/597

(58) Field of Classification Search ................. 257/758, 257/E21.577; 438/597
See application file for complete search history.

(56) References Cited

U.S. PATENT DOCUMENTS

| | | | | |
|---|---|---|---|---|
| 5,961,791 | A * | 10/1999 | Frisa et al. ................ | 204/192.1 |
| 6,004,876 | A * | 12/1999 | Kwon et al. ................ | 438/636 |
| 6,008,075 | A | 12/1999 | Lien et al. | |
| 6,136,723 | A * | 10/2000 | Nagase ........................ | 438/725 |
| 6,174,800 | B1 * | 1/2001 | Jang ............................. | 438/629 |
| 6,313,535 | B1 * | 11/2001 | Iba et al. ..................... | 257/751 |
| 6,348,405 | B1 * | 2/2002 | Ohuchi ........................ | 438/636 |
| 6,531,404 | B1 * | 3/2003 | Nallan et al. ................ | 438/714 |
| 6,939,812 | B2 * | 9/2005 | Broekaart et al. ........... | 438/740 |
| 7,045,455 | B2 * | 5/2006 | Zhang et al. ................ | 438/636 |
| 7,388,633 | B2 * | 6/2008 | Iwasa ........................... | 349/113 |
| 2001/0042919 | A1 * | 11/2001 | Tomita et al. ............... | 257/758 |

(Continued)

FOREIGN PATENT DOCUMENTS

JP          07-249682          9/1995

(Continued)

OTHER PUBLICATIONS

Japanese Patent Office issued a Japanese Office Action dated Jun. 23, 2009, Application No. 2004-283606.

*Primary Examiner*—Kiesha L. Rose
*Assistant Examiner*—Igwe U Anya
(74) *Attorney, Agent, or Firm*—Young & Thompson

(57) ABSTRACT

A semiconductor device having good production stability and excellent in a contact property between an antireflection film on an Al contained metal film and a conductive plug. The device includes a substrate, an insulating interlayer, and a multi-layer structure. The insulating interlayer is formed in the upper portion of the substrate. The structure is provided on the insulating interlayer. A Ti film, a first TiN film, an AlCu film, a Ti film, a second TiN film, and an etching adjustment film are sequentially formed in the structure. The device includes an insulating interlayer and a conductive plug. The insulating interlayer is provided on the insulating interlayer and the structure. The conductive plug penetrates the insulating interlayer and the etching adjustment film, and an end surface of the conductive plug is located in the second TiN film. The conductive plug includes a Ti film, a TiN film, and a W film.

20 Claims, 7 Drawing Sheets

U.S. PATENT DOCUMENTS

| | | | |
|---|---|---|---|
| 2002/0068442 A1* | 6/2002 | Shimpuku | 438/638 |
| 2002/0093097 A1* | 7/2002 | Kamoshima et al. | 257/751 |
| 2003/0025202 A1* | 2/2003 | Mikagi et al. | 257/737 |
| 2003/0170975 A1* | 9/2003 | Griffin et al. | 438/637 |
| 2004/0114075 A1* | 6/2004 | Iwasa | 349/113 |
| 2004/0171239 A1* | 9/2004 | Tanaka et al. | 438/568 |
| 2004/0201057 A1* | 10/2004 | Lien et al. | 257/306 |
| 2005/0046027 A1* | 3/2005 | Kim et al. | 257/750 |
| 2005/0130412 A1* | 6/2005 | Eun | 438/637 |
| 2005/0241671 A1* | 11/2005 | Dong et al. | 134/1.1 |
| 2006/0154472 A1* | 7/2006 | Kikuchi et al. | 438/622 |

FOREIGN PATENT DOCUMENTS

| | | |
|---|---|---|
| JP | 09-017862 | 1/1997 |
| JP | 11-026577 | 1/1999 |
| JP | 11-204636 | 7/1999 |
| JP | 2000-235973 | 8/2000 |
| JP | 2002-1902520 | 7/2002 |
| JP | 2002-319620 | 10/2002 |
| JP | 2002319620 A * | 10/2002 |

* cited by examiner

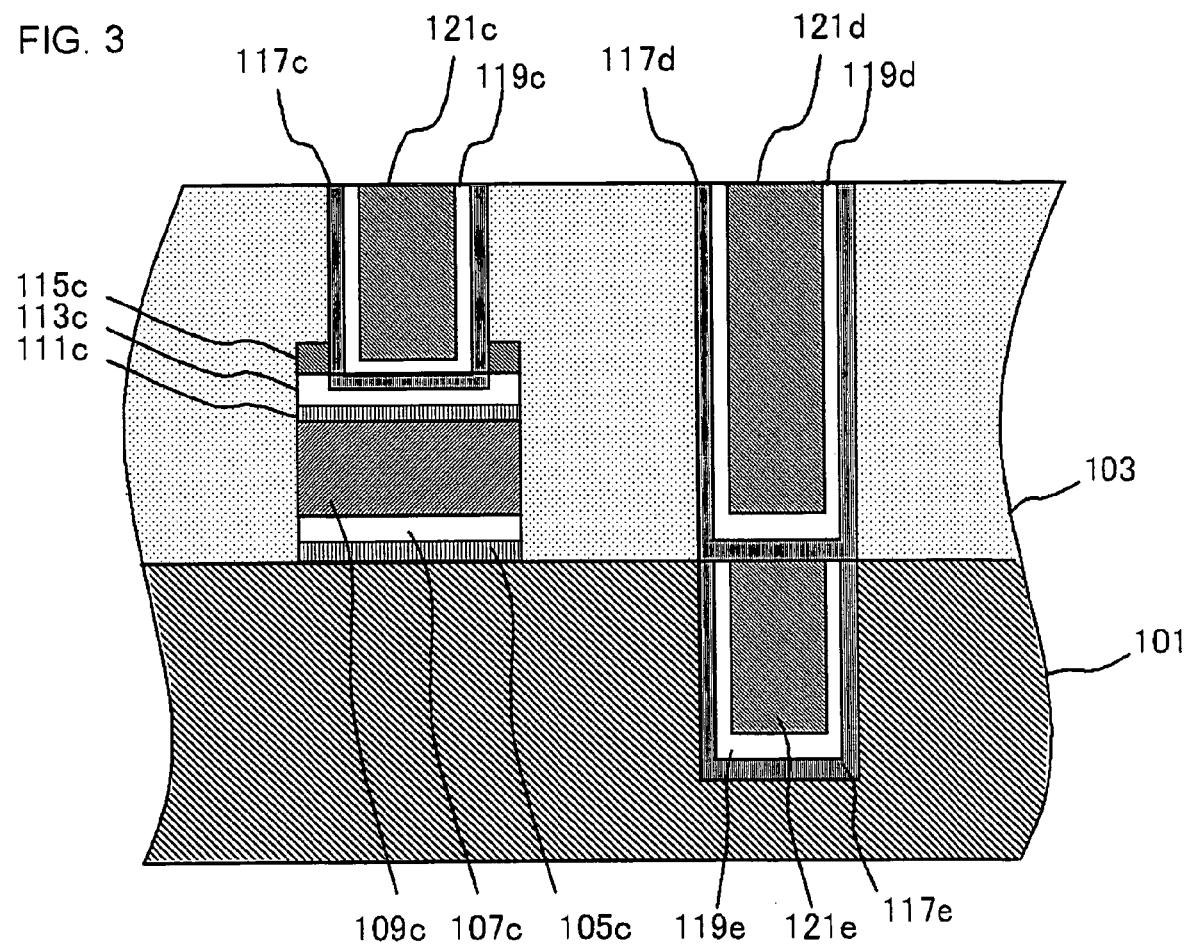

SEMICONDUCTOR DEVICE AND MANUFACTURING METHOD THEREOF

This application is based on Japanese Patent application NO. 2004-283606, the content of which is incorporated hereinto by reference.

BACKGROUND OF THE INVENTION

1. Field of the Invention

The present invention relates to a semiconductor device and a manufacturing method thereof.

2. Description of the Related Art

For example, the conventional methods of manufacturing a semiconductor device are disclosed in Japanese Laid-Open patent publication Nos. 2002-190520 and 2000-235973.

In the above conventional methods of manufacturing a semiconductor device manufacturing methods, an antireflection film is provided on an aluminum interconnection which is a lower layer, a plasma nitride film which works as a stopper during etching is formed on the antireflection film, and an interlayer film which is an insulating film is formed on the plasma nitride film. When a via is formed in the insulating film, first etching is performed on condition that etching selectivity can be ensured between the insulating film and the plasma nitride film. Then, the plasma nitride film is overetched in second etching to make a via hole from which the antireflection film is exposed.

An example of the conventional semiconductor device is disclosed in Japanese Laid-Open patent publication No. 2002-319620. FIG. 8 is a view for explaining a method of making a contact hole shown in Japanese Laid-Open patent publication No. 2002-319620. In the method of making the contact hole, dry etching is performed by using a resist 34 as a mask, and thereby a contact hole 38 is made in a thick insulating interlayer 32 on a lower diffusion layer 24 formed on a surface of a silicon substrate 22 while a contact hole 36 is made in a thin insulating interlayer 32 on a lower interconnection layer 26 formed on an oxide layer 30. Although only the insulating interlayer 32 is etched in making the contact hole 38, the insulating interlayer 32 and an etching delay layer 28 are etched in making the contact hole 36. Then, the resist 34 is removed and post-dry-etching treatments (cleaning and the like) are performed (not shown).

Reactive ion etching in which anisotropic etching can be performed is used as the dry etching in making the contact holes 36 and 38. This is because the anisotropic etching is desirable in making the contact holes 36 and 38 such that the etching does not progress in a lateral direction. However, due to the anisotropic etching, it is difficult that only the insulating interlayer 32 (SiO$_2$ or the like) is etched without etching a lower electrode layer (TiN, AlCu, Ti or the like) 26. In this case, Japanese Laid-Open patent publication No. 2002-319620 states that the formation of the etching delay layer 28 is particularly useful.

However, conventionally, there is room for improvement in the following points.

First, the etching for making the via is performed in twice in the semiconductor device manufacturing methods disclosed in Japanese Laid-Open patent publication Nos. 2002-190520 and 2000-235973. Therefore, the number of production processes and a process time are increased in making the via, and there is still room for improvement from the view points of productivity and the production stability.

Second, in the method of making the contact hole disclosed in Japanese Laid-Open patent publication No. 2002-319620, the resist 34, the insulating interlayer 32, and the etching delay layer 28 are sequentially etched to form the contact hole 36 which reaches an upper surface of the lower interconnection layer 26. However, because the lower interconnection layer 26 is exposed to a bottom portion of the contact hole 36, sometimes Al is eluted in a chemical solution in performing post-etching organic cleaning to the inside of the contact hole with the chemical solution when the lower interconnection layer 26 is made of AlSi. Thus, sometimes the metal elution of the lower interconnection layer 26 into the chemical solution causes a decrease in contact property between the lower interconnection and the via plug provided in the contact hole.

SUMMARY OF THE INVENTION

According to the present invention, there is provided a semiconductor device comprising a semiconductor substrate; a multi-layer structure provided in an upper portion of the semiconductor substrate, in which an aluminum contained metal film, an antireflection film, and an etching adjustment film are sequentially stacked,; an insulating interlayer which is provided on the multi-layer structure; and a conductive plug, which is penetrated said insulating interlayer and said etching adjustment film, is located an end surface of the conductive plug in said antireflection film.

According to the configuration of the invention, unlike the conventional art, an etching stopper film is not used but the etching adjustment film is used, so that an opening can be formed by one-step etching. The opening penetrates the insulating interlayer and the etching adjustment film, and one end portion of the opening reaches the middle of the antireflection film. The etching adjustment film can act as a buffer film of an etching rate to adjust the etching rate. That is, the etching rate is adjusted by adjusting the thickness of the etching adjustment film and the like. Therefore, a variation in thickness of the insulating interlayer to be etched or a variation in etching condition are absorbed, and opening whose one end portion reaches the middle of the antireflection film can be formed by one-step etching.

In the configuration of the invention, the overetching can intentionally be performed at a midpoint in the antireflection film to form the opening without halting the etching at a midpoint in the etching adjustment film. Therefore, even if the variation in thickness of the insulating interlayer or the variation in etching condition is generated, the bottom surface of the opening can securely reach the antireflection film by adjusting the thickness of the etching adjustment film and the like. Therefore, in the subsequent conductive plug forming process, the residual etching adjustment film never remains between the end surface of the conductive plug and the antireflection film, which improves a contact property between the conductive plug formed in the opening and the antireflection film on the aluminum contained metal film.

Further, in the configuration of the invention, because the etching rate is adjusted by the etching adjustment film, the bottom surface of the opening never penetrates the antireflection film, and the bottom surface of the opening can be located in the antireflection film with good controllability. Therefore, Al elution is suppressed in the resist stripping process using organic compound, which improves the contact property between the conductive plug formed in the opening and the antireflection film on the aluminum contained metal film.

Accordingly, in the configuration of the invention, the semiconductor device which is excellent in the contact property between the antireflection film on the Al contained metal film and the conductive plug can be obtained with good production stability.

Further, according to the present invention, there is provided a method of manufacturing semiconductor device comprising: a step of forming a multi-layer structure in which an aluminum contained metal film, an antireflection film, and an etching adjustment film are sequentially stacked; a step of forming an insulating interlayer on said multi-layer structure; a step of making an opening, which penetrates said insulating interlayer and said etching adjustment film, is located an end portion of the opening in said antireflection film by etching said insulating interlayer, said etching adjustment film, and said antireflection film with the same etching gas; and a step of forming a conductive plug whose end surface is located in said antireflection film by forming an electrically conductive film in said opening.

According to the method of the invention, unlike the conventional art, the etching stopper is not used but the etching adjustment film is used, so that the opening can be formed by one-step etching. The opening penetrates the insulating interlayer and the etching adjustment film, and one end portion of the opening reaches the middle of the antireflection film.

In the method of the invention, the overetching can intentionally be performed at a midpoint in the antireflection film to form the opening without halting the etching at a midpoint in the etching adjustment film. Therefore, even if the variation in thickness of the insulating interlayer or the variation in etching condition is generated, the bottom surface of the opening can securely reach the antireflection film. Therefore, in the subsequent conductive plug forming process, the residual etching adjustment film never remains between the end surface of the conductive plug and the antireflection film, which improves the contact property between the antireflection film on the aluminum contained metal film and the conductive plug formed in the opening.

Further, in the method of the invention, because the etching rate is adjusted by the etching adjustment film, the bottom surface of the opening never penetrates the antireflection film, and the bottom surface of the opening can be located in the antireflection film with good controllability. Therefore, the Al elution is suppressed in the resist stripping process using organic compound, which improves the contact property between the conductive plug formed in the opening and the antireflection film on the aluminum contained metal film.

Accordingly, in the method of the invention, the semiconductor device which is excellent in the contact property between the antireflection film and the conductive plug on the Al contained metal film can be obtained with good production stability.

In the invention, the etching adjustment film should mean a film having a function of delaying the etching rate without stopping the bottom surface of the opening, during forming the opening which penetrates the etching adjustment film. That is, the etching adjustment film is provided on the antireflection film, and the etching adjustment film adjusts the etching rate such that the etching is halted while the bottom surface of the opening is located in the antireflection film. Accordingly, the etching adjustment film should have a concept different from the etching stopper.

According to the invention, the overetching can intentionally be performed at a midpoint in the antireflection film to form the opening without halting the etching at a midpoint in the etching adjustment film. Therefore, the semiconductor device which is excellent in the contact property between the antireflection film on the Al contained metal film and the conductive plug can be obtained with good production stability.

In a semiconductor device according to the invention, it is possible that a depth from an upper surface of the antireflection film to an end surface of the conductive plug ranges $1/10$ or more and $9/10$ or less of the film thickness of the antireflection film.

According to the configuration of invention, the etching may intentionally be performed to the depth ranging $1/10$ or more and $9/10$ or less of the film thickness of the antireflection film to form the opening without halting the etching at a midpoint in the etching adjustment film. Therefore, no bottom surface of the opening reaches the antireflection film, and no bottom surface of the opening penetrates the antireflection film, so that the bottom surface of the opening can be located in the antireflection film with good controllability. As a result, the contact property between the conductive plug formed in the opening and the antireflection film on the aluminum contained metal film is improved.

In a semiconductor device according to the invention, the etching adjustment film may be a SiON film.

According to the configuration of the invention, since the etching rate is slower in the SiON film compared with a $SiO_2$ film generally used for the insulating interlayer, the etching rate can be adjusted with high accuracy by adjusting the thickness of the SiON film.

In a semiconductor device according to the invention, it is possible that a plurality of multi-layer structures are provided in same level and the plurality of said etching adjustment film included in the plurality of said multi-layer structures are composed of the film formed in the same process.

According to the configuration of the invention, when a width of the opening is substantially equal to a width of the Al contained metal film, an etching width margin is increased, so that the dimension of the bottom portion of the opening can be enlarged. Further, exposure of the side surface of the contained metal film can be prevented in the opening, which decreases via resistance of the conductive plug formed in the opening.

In a semiconductor device according to the invention, the etching adjustment film may be provided on a side surface of the aluminum contained metal film, a upper surface and a side surface of the antireflection film.

According to the configuration of the invention, in patterning the multi-layer structure, it is not necessary to etch the etching adjustment film. It takes a long time to etch the etching adjustment film. Therefore, the semiconductor device manufacturing process becomes simplified, which improves productivity.

It is possible that a semiconductor device according to the invention further includes a second conductive plug in the insulating interlayer, the second conductive plug being formed through the same process as the conductive plug, wherein the conductive plug and the second conductive plug differ from each other in a length.

According to the configuration of the invention, in the opening for forming the conductive plug, the etching rate can be adjusted with high accuracy by adjusting the thickness of the etching adjustment film. Therefore, even if the two openings are etched by the etching in the same process, the two openings having the different lengths can be formed, which allows the two conductive plugs having the different lengths to be formed with good production stability.

In a method of manufacturing a semiconductor device according to the invention, it is possible that the etching gas is one which includes a fluorocarbon compound expressed by a general formula of $C_xF_y$ (x is real numbers 4 more than and y is a positive real number).

According to the method of the invention, although the etching rates are different from one another in the etching gases including the fluorocarbon compounds, the etching gases including the fluorocarbon compounds can etch any one of the insulating interlayer, the etching adjustment film, and the antireflection film, so that the opening can be made by the one-step etching.

BRIEF DESCRIPTION OF THE DRAWINGS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

FIG. 3 is a cross-sectional view schematically showing a semiconductor device according to a second embodiment;

DETAILED DESCRIPTION OF THE EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

It is apparent that the present invention is not limited to the above embodiment, which may be modified and changed without departing from the scope and spirit of the invention.

The embodiments of the invention will be described below with reference to the accompanying drawings. In all the drawings, the same constituent is indicated by the same reference number, and the description will not be described as appropriate.

First Embodiment

Figure 1:
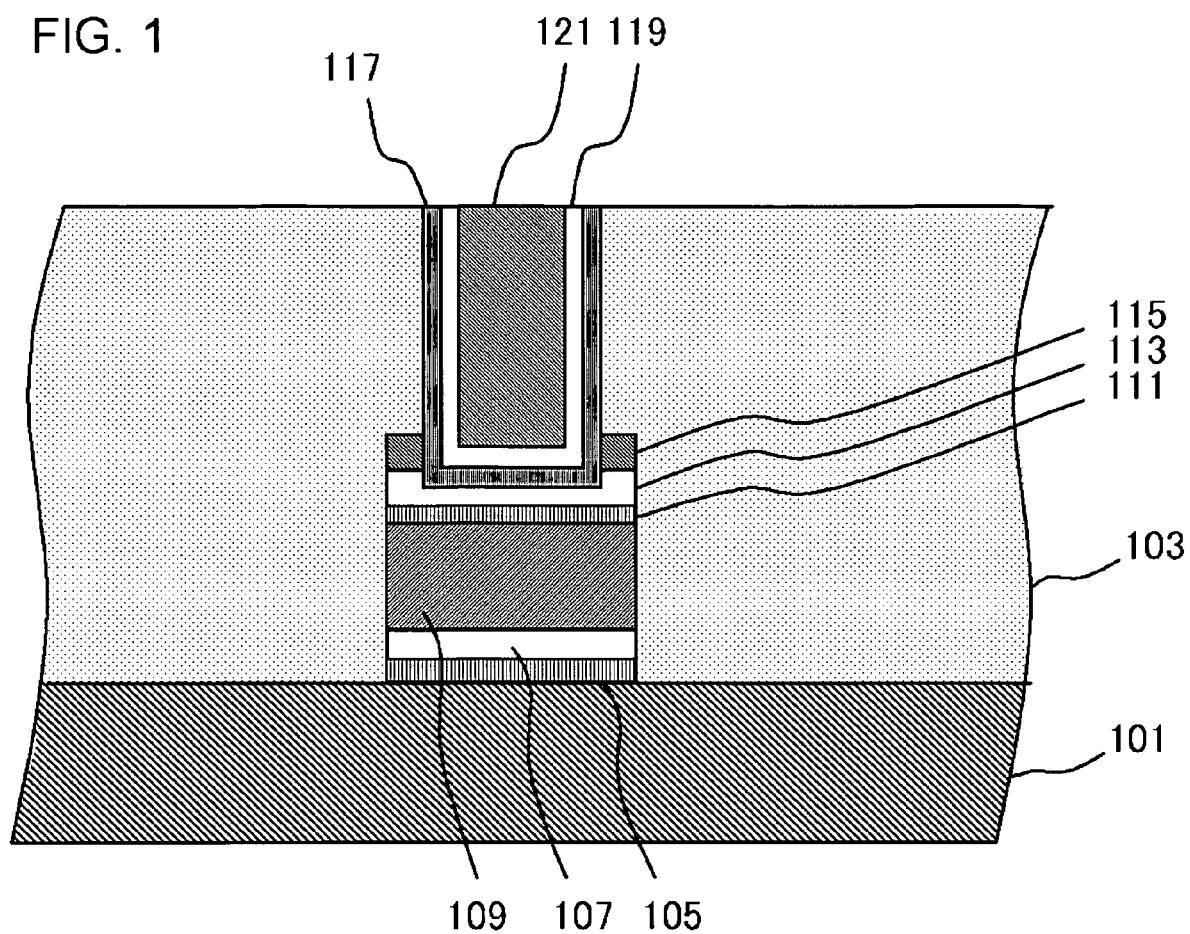
FIG. 1 is a cross-sectional view schematically showing a part of a semiconductor device according to a first embodiment.

FIG. 1 is a cross-sectional view schematically showing a part of a semiconductor device according to a first embodiment.

A semiconductor device according to the first embodiment includes a semiconductor substrate, an insulating interlayer 101, and a multi-layer structure. The insulating interlayer 101 is formed in the upper portion of the semiconductor substrate. The multi-layer structure is provided on the insulating interlayer 101. An adhesive film (Ti film 105 and TiN film 107), an aluminum-contained metal film (AlCu film 109), an antireflection film (Ti film 111 and TiN film 113), and an etching adjustment film 115 are sequentially stacked and form the multi-layer structure. The semiconductor device includes an insulating interlayer 103 and a conductive plug (Ti film 117, TiN film 119, and W film 121). The conductive plug penetrates the insulating interlayer 103 which is provided on the multi-layer structure, and the etching adjustment film 115, and an end surface of the conductive plug is located in the antireflection film (Ti film 111 and TiN film 113).

Figure 2:
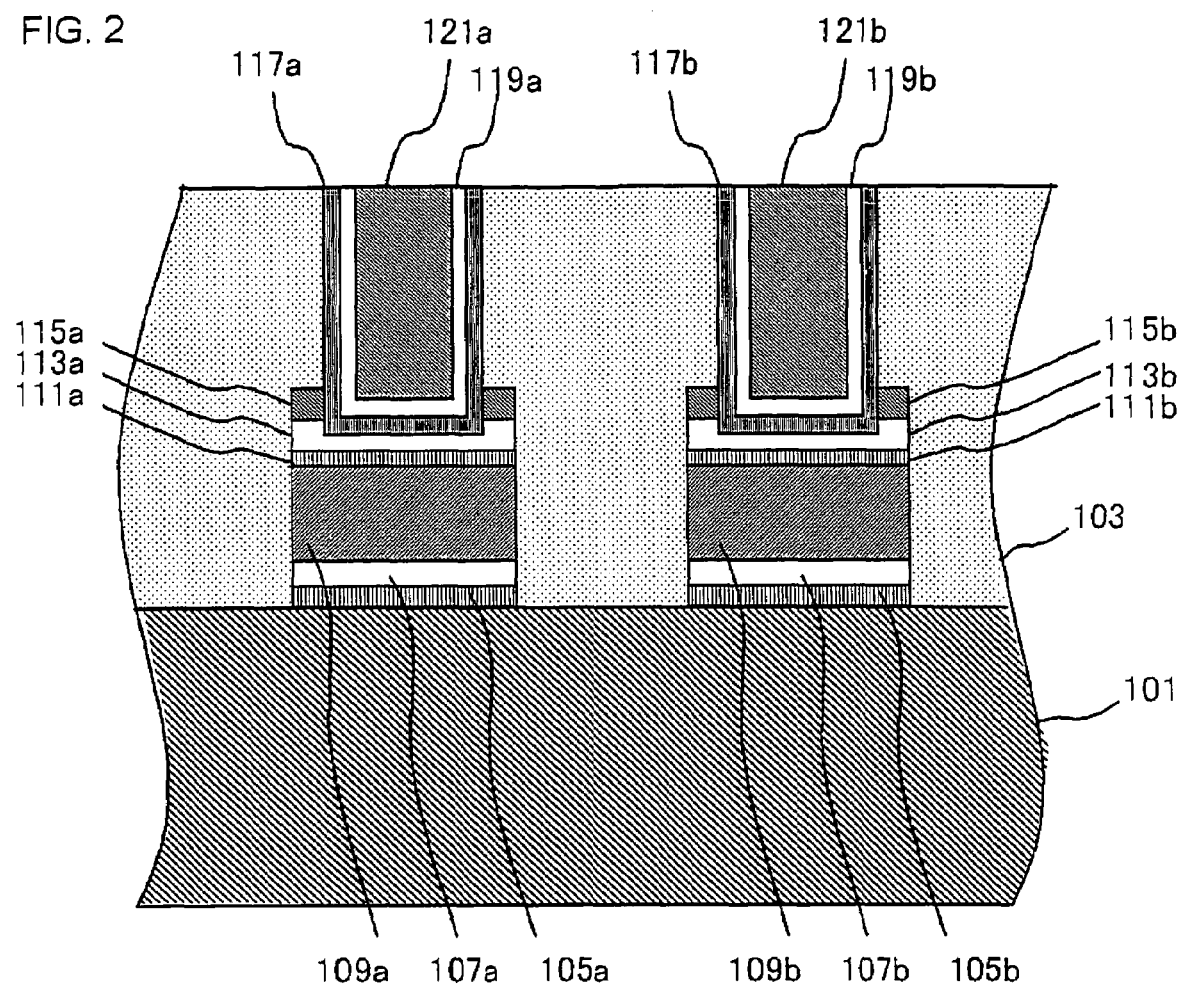
FIG. 2 is a cross-sectional view schematically showing a part of the semiconductor device according to the first embodiment when viewed with a broader perspective compared with FIG. 1.

FIG. 2 is a cross-sectional view schematically showing a part of the semiconductor device according to the first embodiment when viewed with a broader perspective compared with FIG. 1.

The semiconductor device according to the first embodiment includes the plural multi-layer structures in which the adhesive film (Ti film 105 and TiN film 107), the aluminum-contained metal film (AlCu film 109), the antireflection film (Ti film 111 and TiN film 113), and the etching adjustment film 115 are sequentially formed. The semiconductor device includes the insulating interlayer 103 and the two conductive plugs (Ti film 117, TiN film 119, and W film 121) in each multi-layer structure. The conductive plug penetrates the insulating interlayer 103 which is provided on the multi-layer structure, and the etching adjustment film 115, and one end portion of the conductive plug is embedded in the antireflection film (Ti film 111 and TiN film 113).

As used herein, the term of etching adjustment film should mean the concept different from the etching stopper 115. That is, the etching adjustment film 115 never halts a leading end portion of the opening made by the etching within the film, and the etching adjustment film 115 is one which has a function of delaying an etching rate in making the opening penetrating the etching adjustment film 115.

A method of manufacturing semiconductor device according to the first embodiment will be described below.

Figure 4A:
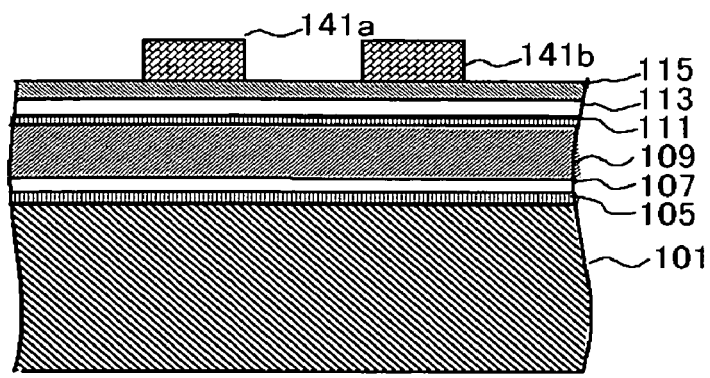
FIG. 4A is a process cross-sectional view for explaining a method of manufacturing semiconductor device according to the first embodiment.

FIGS. 4A to 4D are process cross-sectional views for explaining the method of manufacturing the semiconductor device manufacturing according to the first embodiment. First the insulating interlayer 101 made of $SiO_2$ is formed in the upper portion of a semiconductor substrate (not shown). Then, the Ti film 105, the TiN film 107, the AlCu film 109, the Ti film 111, the TiN film 113, and the etching adjustment film 115 are sequentially formed on the insulating interlayer 101. Resists 141a and 141b are formed on the etching adjustment film 115 (FIG. 4A).

Figure 4B:
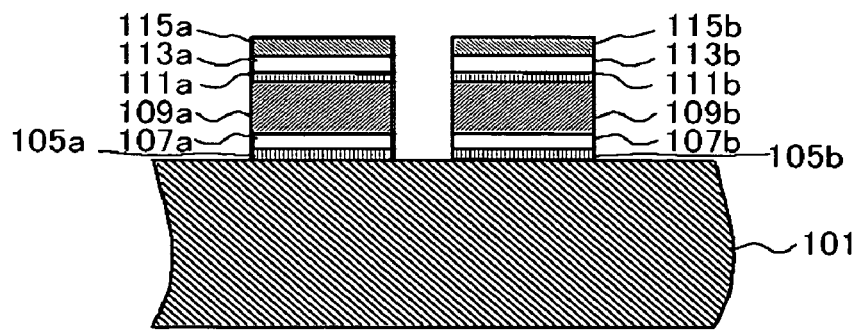
FIG. 4B is a process cross-sectional view for explaining a method of manufacturing semiconductor device according to the first embodiment.

Patterning is performed to form the multi-layer structure by etching the Ti film 105, the TiN film 107, the AlCu film 109, the Ti film 111, the TiN film 113, and the etching adjustment film 115 with the resists 141a and 141b as a mask. Then, the resists 141a and 141b are removed (FIG. 4B).

Figure 4C:
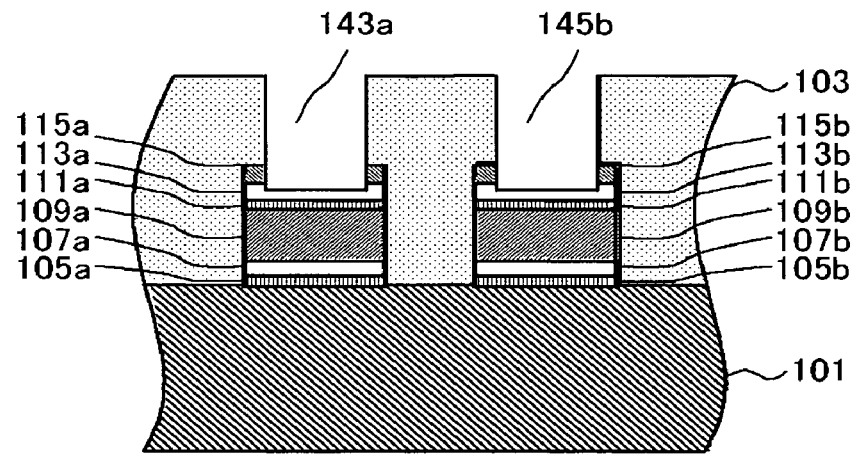
FIG. 4C is a process cross-sectional view for explaining a method of manufacturing semiconductor device according to the first embodiment.

Subsequently, the insulating interlayer 103 is formed on the insulating interlayer 101 and the multi-layer structure. A resist (not shown) is formed on the insulating interlayer 103. Openings 143a and 145b are made by etching the insulating interlayer 103, the etching adjustment films 115a and 115b, and the TiN films 113a and 113b with the resist as the mask (FIG. 4C). At this point, the leading end portions of the openings 143a and 145b are adjusted so as to stop at midpoints in the TiN films 113a and 113b respectively.

Figure 4D:
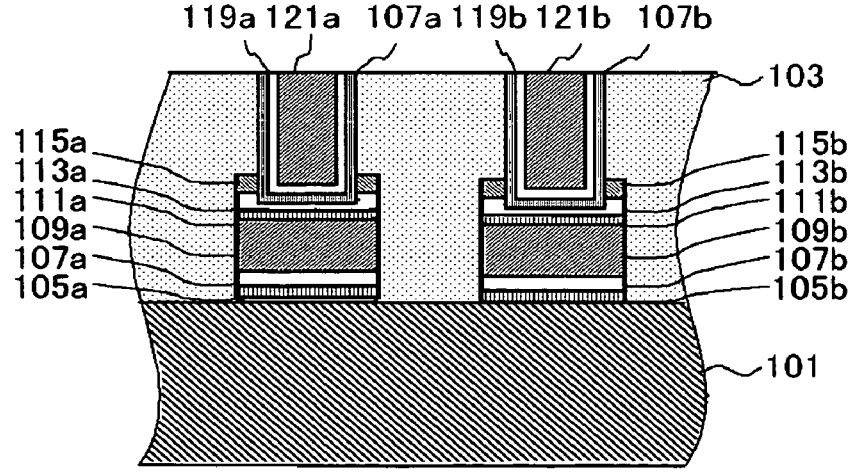
FIG. 4D is a process cross-sectional view for explaining a method of manufacturing a semiconductor device according to the first embodiment.

An argon plasma treatment is performed to the insides of the openings 143a and 145b to remove etching residues. Barrier metal films (Ti films 117a and 117b and TiN films 119a and 119b) are formed on inner walls of the openings 143a and 145b by sputtering. Tungsten films 121a and 121b are formed on the barrier metal films by a CVD method. Then, the excessive Ti films 117a and 117b, TiN films 119a and 119b, and tungsten films 121a and 121b, which are located on the insulating interlayer 103, are removed and planarized by CMP (Chemical Mechanical Polishing) (FIG. 4d).

Etching gases containing fluorocarbon compounds are used as the etching gas in making the openings 143a and 145b. The fluorocarbon compound is expressed by a general formula of $C_xF_y$ (x is real numbers 4 or more and y is a positive real number). Although the etching rates are different from one another in these etching gases, the etching gases can etch the insulating interlayer 103, the etching adjustment film 115, and the TiN film 113. In making the openings 143a and 145b, both the openings 143a and 145b are etched at one stage by using the same etching gas.

The etching adjustment film 115 can be formed by any film made of the material whose etching rate is slower than that of $SiO_2$ (etching selectivity can be ensured between the material and the $SiO_2$ film). For example, the film including Si and N or C can be used as the etching adjustment film 115. More specifically the film including SiON, SiN, SiC, or SiCN can preferably be used. Among others, when the SiON film is used, good dimensional accuracy and excellent processability are obtained in etching the etching adjustment film 115.

The thicknesses and the materials of the etching adjustment films 115a and 115b are determined such that the progress of the bottom surfaces of the openings 143a and 145b is halted in the TiN film 113 even if the variation in thickness of the insulating interlayer 103 or the variation in etching condition is generated. That is, the openings 143a and 145b (via) are made by, e.g., the plasma etching, and the thickness of the etching adjustment film 115 can be determined from the $SiO_2$/SiON etching selectivity of the etching gas. At this point, the etching selectivity may be adjusted while the thickness of the etching adjustment film 115 is fixed, such that the variation in thickness of the insulating interlayer 103 can be absorbed. For example, when $C_4F_8$/(CO)/Ar/$O_2$ gas is used as the etching gas, the etching selectivity can effectively be changed by adjusting an $O_2$ flow rate, a $C_4F_8$ flow rate, or a wafer temperature.

The thickness and the etching selectivity of each of the etching adjustment films 115a and 115b are selected such that the leading end portions of the openings 143a and 145b penetrate the etching adjustment film 115 in etching the openings 143a and 145b. For example, when the thickness of the etching adjustment film made of SiON is 35 nm, the variation in thickness of the insulating interlayer 103 having the maximum of 500 nm can be absorbed by setting the etching selectivity between the $SiO_2$ film and the SiON film at about 15.

The thickness of the etching adjustment film 115 is determined as appropriate, and the thickness is not particularly limited. Preferably the thickness of the etching adjustment film 115 ranges 10 nm or more and 50 nm or less. Specifically, for example, the thickness of the etching adjustment film 115 is set at 35 nm. When the thickness of the etching adjustment film 115 is within the above range, the overetching of the opening (via) can be performed into the TiN films 113a and 113b without halting the etching of the opening (via) in the etching adjustment films 115a and 115b formed by the Si insulating compound. Therefore, the TiN films 113a and 113b can securely be exposed. Thus, the overetching is intentionally performed to remove the etching adjustment film 115 in the openings 143a and 145b, and the TiN films 113a and 113b on the Ti films 111a and 111b located on the AlCu films 109a and 109b can be exposed in the openings 143a and 145b respectively.

The thicknesses of the TiN films 113a and 113b are determined as appropriate, and the thicknesses are not particularly limited. Preferably the thicknesses of the TiN films 113a and 113b range 10 nm or more and 200 nm or less. Specifically, for example, the thickness of the TiN films 113a and 113b are set at 75 nm. When the thicknesses of the TiN films 113a and 113b are within the above range, the progress of the bottom surfaces of the openings 143a and 145b can be halted in the TiN films 113a and 113b in the etching. Further, Al elution can sufficiently be suppressed in the resist stripping process using organic compound.

The Ti films 111a and 111b may be omitted. When the Ti films 111a and 111b are provided, the thicknesses of the Ti films 111a and 111b preferably range 5 nm or more and 50 nm or less. Specifically, for example, the thickness of Ti films 111a and 111b are set at 20 nm. When the thicknesses of the Ti films 111a and 111b are within the above range, even if the bottom surfaces of the openings 143a and 145b are located near the bottom surfaces of the TiN film 113a and 113b, the Al elution can sufficiently be suppressed in the resist stripping process using organic compound.

In the case where the thicknesses of the TiN films 113a and 113b are set at 55 nm, the embedded depths of the leading end portions of the openings 143a and 145b into the TiN films 113a and 113b are determined as appropriate and the embedded depths are not particularly limited. For example, the embedded depths range 5 nm (about 1/10 of the thickness) or more and 50 nm (about 9/10 of the thickness) or less. Specifically the embedded depths range 10 nm or more and 30 nm or less. When the embedded depth is in the above range, because a sufficient control margin of the embedded depth exists, the end portions of the openings 143a and 145b can securely be formed in the TiN films 113a and 113b, even if the etching conditions are varied in some degree.

The interaction effects of the semiconductor device according to the first embodiment will be described below.

According to the semiconductor device of the first embodiment, the semiconductor device which is excellent in the contact property between the antireflection film on the Al contained metal film 109 and the conductive plug can be obtained with good production stability. That is, the etching adjustment film 115 formed by the Si insulating compound containing N or C, such as SiON, SiN, SiC, and SiCN, is further provided on the antireflection film (Ti film 111 and TiN film 113) on the Al contained metal film 109 in the semiconductor device of the first embodiment. Therefore, in the dry etching for making the opening (via), the etching rate is selectively decreased and the thickness of the etching adjustment film 115 and the etching selectivity of the etching gas are adjusted, which allows the thickness of the TiN residual film to stably be controlled. Accordingly, even if the variation in thickness of the insulating interlayer 103 and the variation in etching condition are generated, the openings 143a and 145b can be controlled so as to penetrate the insulating interlayer 103 and the etching adjustment film 115 to halt the progress at a midpoint in the TiN film 113. As a result, the Al elution is not generated in the resist stripping process using organic compound and the contact property between the conductive plug and the TiN film 113 on the Al contained metal film 109 is improved.

Figure 7A:
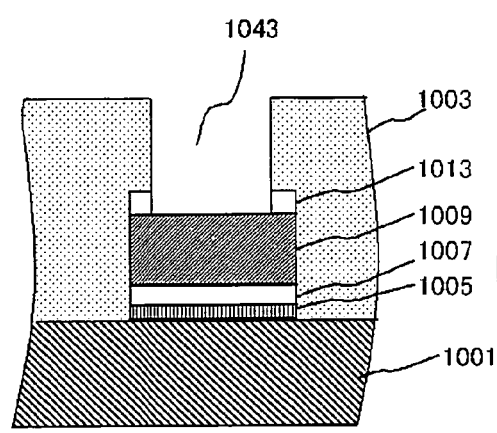
FIG. 7A is a view for explaining a TiN-excluded via making process.
Figure 7B:
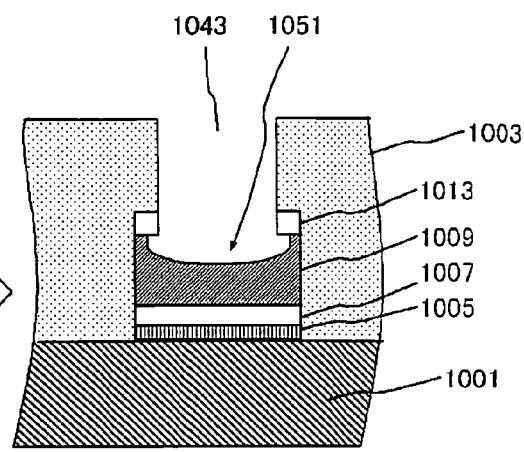
FIG. 7B is a view for explaining a TiN-excluded via making process.
Figure 8:
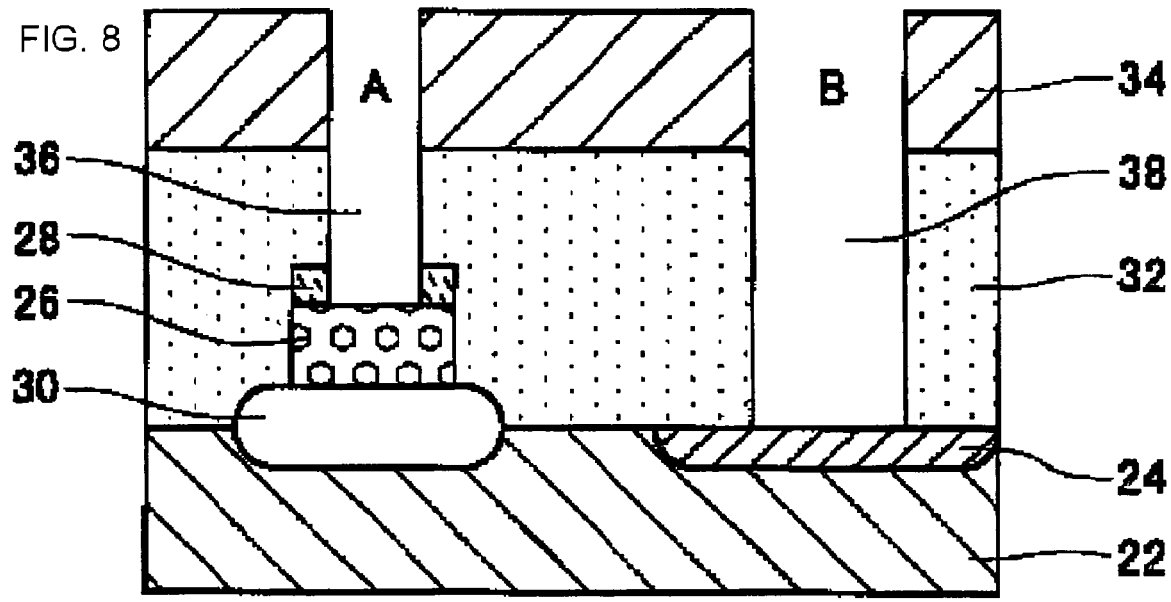
FIG. 8 is a view for explaining a method of making a conventional contact hole.

FIGS. 7A and 7B are views for explaining a via making process in which the etching adjustment film is not particularly provided. In this process, as shown in FIG. 7A, a multi-layer structure is provided on a first insulating interlayer 1001. A Ti film 1005, a TiN film 1007, an AlCu film 1009, and a TiN film 1013 are sequentially formed in the multi-layer structure. A second insulating interlayer 1003 is provided on the multi-layer structure and the first insulating interlayer 1001. A opening 1043 is made by etching and remove in the second insulating interlayer 1003 and the TiN film 1013. Then, as shown in FIG. 7B, organic cleaning is performed to the inside of the opening 1043. At this point, Al is eluted from the AlCu film 1009 in the bottom portion of the opening 1043, and a damaged region 1051 is formed.

Therefore, in order to sufficiently suppress the Al elution, it is necessary that the TiN residual film is stably and sufficiently secured on the surface of the AlCu film 1009 after the via dry etching. However, because a variation in etching accuracy is always generated during the dry etching process, it is difficult to sufficiently secure the TiN residual film. Therefore, in the resist stripping process using organic compound, the Al elution is easy to occur from AlCu film 1009, which easily induces causes such as Ti attacking and contaminant generation which generates opening defect of the opening.

Even if the etching adjustment film is not particularly provided, sometimes the via can be formed with the TiN film is left by strictly adjusting the etching conditions. However, in order to sufficiently suppress the Al elution, it is necessary that the TiN residual film is stably and sufficiently secured on the surface of the AlCu film 1009 after the via dry etching, and it is necessary that performance of the dry etching apparatus is improved and associated processes are strictly managed. Therefore, countermeasures such as the increase in thickness of the TiN film on the Al interconnection, the performance improvement of the dry etching apparatus (TiN high etching selectivity), throughput improvement of the associated processes, introduction of CVD Ti/TiN apparatus, and the decrease in via aspect ratio are generally adopted.

However, these countermeasures lead to increase in via resistance, increase investment, decrease in production stability, the decrease in device performance, and the increase in limitation in design.

In Japanese Laid-Open patent publication Nos. 2002-190520, 2000-235973 and 2002-319620, the etching stopper or the etching delay film is further provided on the antireflection film on the Al contained metal film. However, the overetching of the antireflection film never occurs because the etching stopper or the etching delay film is provided in order to halt the etching at the upper surface of the antireflection film. Therefore, sometimes the etching depth becomes insufficient due to the variation in etching conditions or the variation in thickness of the insulating interlayer. As a result, the etching stopper which is not removed by the etching remains in the opening, so that the contact property between the conductive plug and the antireflection film on the Al contained metal film.

On the contrary, in the first embodiment, the etching adjustment film is further provided on the antireflection film on the Al contained metal film to adjust the etching rate of the opening, and the etching conditions are controlled such that the bottom surface of the opening is located in the antireflection film. Therefore, no bottom surface of the opening reaches the antireflection film and no bottom surface of the opening penetrates antireflection film. Accordingly, the semiconductor device which is excellent in the contact property between the conductive plug and the antireflection film on the Al contained metal film can be obtained with good production stability.

Second Embodiment

A semiconductor device according to a second embodiment basically has the same configuration as the semiconductor device according to the first embodiment except that the semiconductor device according to the second embodiment has a multi-depth via in which two conductive plugs having different lengths are provided. FIG. 3 is a cross-sectional view schematically showing the semiconductor device according to the second embodiment.

The semiconductor device according to the second embodiment includes the semiconductor substrate, the insulating interlayer 101, and the multi-layer structure formed on the insulating interlayer 101. The insulating interlayer 101 is formed in the upper portion of the semiconductor substrate. An adhesive film (Ti film 105c and TiN film 107c), an aluminum-contained metal film (AlCu film 109c), an antireflection film (Ti film 111c and TiN film 113c), and an etching adjustment film 115c are sequentially formed in the multi-layer structure. The semiconductor device includes the insulating interlayer 103 and a conductive plug (Ti film 117c, TiN film 119c, and W film 121c). The insulating interlayer 103 is provided on the insulating interlayer 101 and the multi-layer structure. The conductive plug penetrates the insulating interlayer 103 and the etching adjustment film 115, and an end surface of the conductive plug is located in the antireflection film (Ti film 111c and TiN film 113c).

The semiconductor device according to the second embodiment further includes a second conductive plug (Ti film 117d, TiN film 119d, and W film 121d) in the insulating interlayer 103. The second conductive plug is formed through the same process as the conductive plug (Ti film 117c, TiN film 119c, and W film 121c). The conductive plug and the second conductive plug differ from each other in the length. The semiconductor device according to the second embodiment also includes a third conductive plug (Ti film 117e, TiN film 119e, and W film 121e) in the insulating interlayer 101. The lower surface of the second conductive plug is connected to the upper surface of the third conductive plug.

A method of manufacturing the semiconductor device according to the second embodiment will be described.

FIG. 5A to 5D are a process cross-sectional views for explaining the method of the semiconductor device to the second embodiment. First the insulating interlayer 101 made of $SiO_2$ is formed on the upper portion of the semiconductor substrate (not shown). The resist (not shown) is formed on the insulating interlayer 101. The opening is made by etching the insulating interlayer 101 with the resist as the mask.

The argon plasma treatment is performed to the inside of the opening to remove the etching residues. The barrier metal film (Ti film 117e and TiN film 119e) is formed by the sputtering. Tungsten film 121e is formed on the barrier metal film by the CVD method. Then, the excessive Ti film 117e, TiN film 119e, and tungsten film 121e, which are located on the upper portion of the insulating interlayer 101, are removed and planarized by CMP (Chemical Mechanical Polishing). Thus, the conductive plug (Ti film 117e, TiN film 119e, and tungsten film 121e) is formed in the insulating interlayer 101.

Figure 5A:
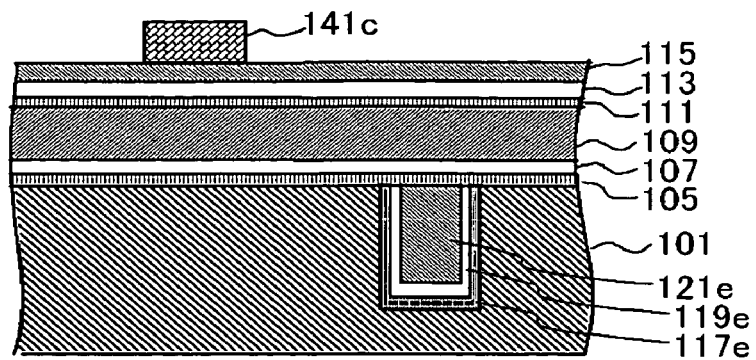
FIG. 5A is a process cross-sectional view for explaining a method of manufacturing a semiconductor device according to the second embodiment.

Then, the Ti film 105, the TiN film 107, the AlCu film 109, the Ti film 111, the TiN film 113, and the etching adjustment film 115 are sequentially formed on the insulating interlayer 110. Resist 141c is formed on the etching adjustment film 115 (FIG. 5A).

Figure 5B:
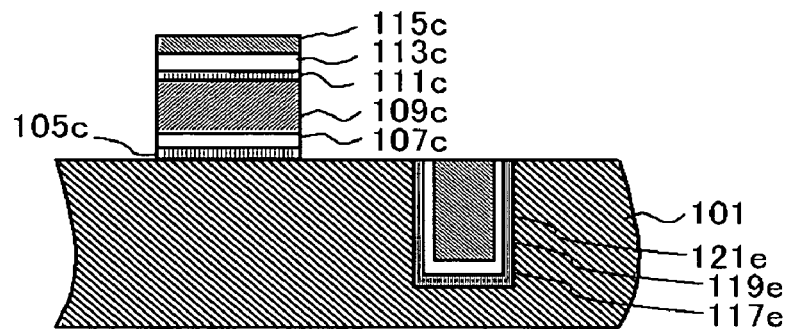
FIG. 5B is a process cross-sectional view for explaining a method of manufacturing a semiconductor device according to the second embodiment.

The patterning is performed by etching the Ti film 105, the TiN film 107, the AlCu film 109, the Ti film 111, the TiN film 113, and the etching adjustment film 115 with the resist 141c as the mask to form the multi-layer structure made of the films. Then, the resist 141c is removed (FIG. 5B).

Figure 5C:
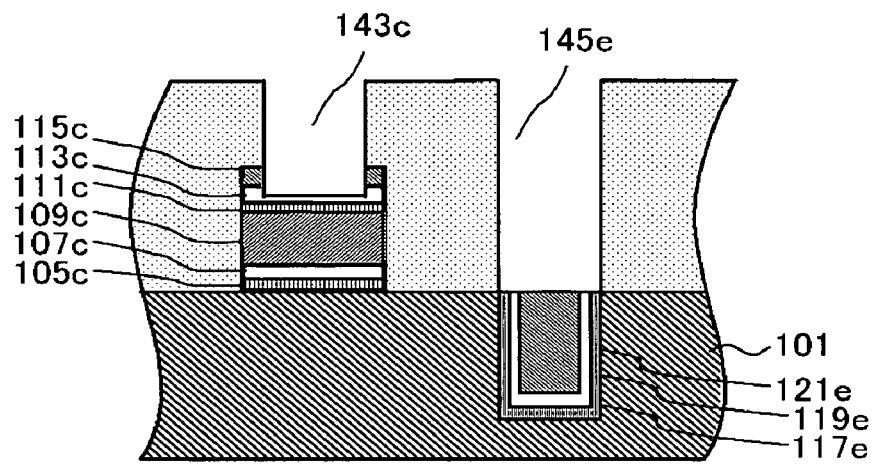
FIG. 5C is a process cross-sectional view for explaining a method of manufacturing a semiconductor device according to the second embodiment.

The insulating interlayer 103 is formed on the insulating interlayer 101 and the multi-layer structure. The resist (not shown) is formed on the insulating interlayer 103. Hole opening 143c is made by etching the insulating interlayer 103, the etching adjustment film 115c, and the TiN film 113c with the resist as the mask. The opening 145e is formed by the same etching process of the insulating interlayer 103 (FIG. 5C).

At this point, the leading end portion of the opening 143c is adjusted so as to stop at a midpoint in the TiN film 113c. The leading end portion of the opening 145e reaches the upper surface of the third conductive plug (Ti film 117e, TiN film 119e, W film 121e) to expose the upper surface of the third conductive plug.

Figure 5D:
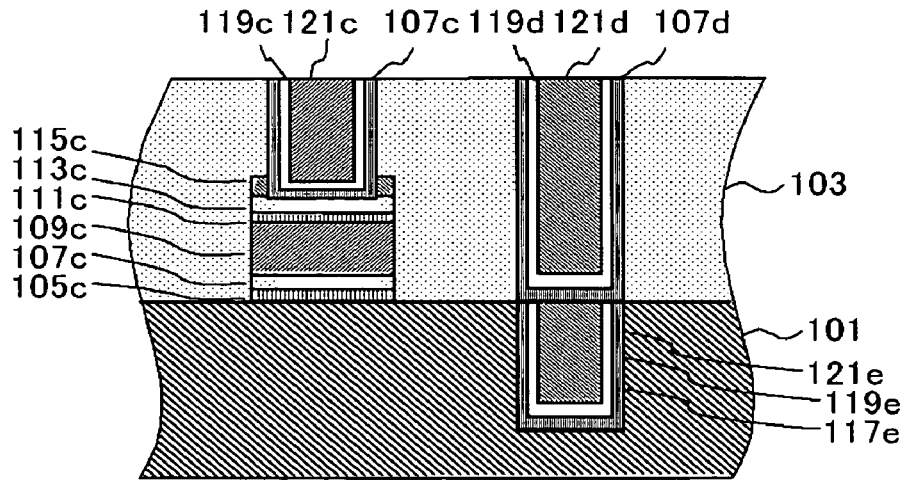
FIG. 5D is a process cross-sectional view for explaining a method of manufacturing a semiconductor device according to the second embodiment.

Then, the argon plasma treatment is performed to the insides of the openings 143c and 145e to remove the etching residues. The barrier metal films (Ti films 117c and 117e and TiN films 119c and 119e) are formed by the sputtering. The tungsten films 121c and 121e are formed on the barrier metal films by the CVD method. The excessive Ti films 117c and 117e, TiN films 119c and 119e, and tungsten films 121c and 121e, which are located on the insulating interlayer 103, are removed and planarized by CMP (Chemical Mechanical Polishing) (FIG. 5D).

The etching gases containing fluorocarbon compounds are used as the etching gas in making the openings 143c and 145e. The fluorocarbon compound is expressed by the general formula of $C_xF_y$ (x is real numbers 4 or more and y is a positive real number). Although the etching rates are different from one another in these etching gases, the etching gases can etch the insulating interlayer 103, the etching adjustment film 115, and the TiN film 113. In making the openings 143c and 145e, both the openings 143c and 145e are etched at one stage in the same process by using the same etching gas.

In the second embodiment, similarly the thickness and the material of the etching adjustment film 115c are determined such that the progress of the bottom surface of the openings 143c is halted in the TiN film 113 even if the variation in thickness of the insulating interlayer 103 or the variation in etching condition is generated. Further, the thickness and the material of the etching adjustment film 115c are determined such that the bottom surface of the opening 145e reaches the upper surface of the third conductive plug (Ti film 117e, TiN film 119e, W film 121e) at the time when the bottom surface of the opening 143c reaches the inside of the TiN film 113.

The thickness and the etching selectivity of the etching adjustment film 115c are selected such that the leading end portion of the openings 143c penetrates the etching adjustment film 115c. For example, when the thickness of the etching adjustment film made of SiON is 35 nm, the variation in thickness of the insulating interlayer 103 having the maximum of 700 nm can be absorbed by setting the etching selectivity between the $SiO_2$ film and the SiON film at about 20. For example, when the $C_4F_8/(CO)/Ar/O_2$ gas is used as the etching gas, the etching selectivity can effectively be changed by adjusting the $O_2$ flow rate, the $C_4F_8$ flow rate, or the wafer temperature.

The thickness of the etching adjustment film 115c is determined as appropriate, and the thickness is not particularly limited. Preferably the thickness of the etching adjustment film 115c ranges 10 nm or more and 50 nm or less. Specifically, for example, the thickness of the etching adjustment film 115c is set at 35 nm. When the thickness of the etching adjustment film 115c is within the above range, at the time when the bottom surface of the opening 145e reaches the upper surface of the third conductive plug (Ti film 117e, TiN film 119e, and W film 121e), the overetching of the opening (via) can be performed into the TiN film 113 without halting the etching of the opening (via) in the etching adjustment film 115 formed by the Si insulating compound. Therefore, the TiN film 113c can securely be exposed. Thus, the overetching is intentionally performed to remove the etching adjustment film 115 in the opening 143a and 145b, and the TiN film 113 on the Ti film 111 located on the AlCu film 109 can be exposed in the opening 143c and 145b.

The thickness of the TiN film 113c is determined as appropriate, and the thickness is not particularly limited. Preferably the thickness of the TiN film 113c ranges 10 nm or more and 200 nm or less. Specifically, for example, the thickness of the TiN film 113c is set at 75 nm. When the thickness of the TiN film 113c is within the above range, the progress of the bottom surfaces of the opening 143c can be halted in the TiN film 113c at the time when the bottom surface of the opening 145e reaches the upper surface of the third conductive plug (Ti film 117e, TiN film 119e, and W film 121e). Further, the Al elution can sufficiently be suppressed in the resist stripping process using organic compound.

The thickness of the Ti film 111c preferably ranges 5 nm or more and 50 nm or less. Specifically, for example, the thickness of the Ti film 111c is set at 20 nm. When the thickness of the Ti film 111c is within the above range, even if the bottom surfaces of the opening 143c is located near the bottom surfaces of the TiN film 113c, the Al elution can sufficiently be suppressed in the resist stripping process using organic compound. The Ti film 111c may be not provided.

In the case where the thickness of the TiN film 113c is set at 55 nm, the embedded depth of the leading end portion of the opening 143c into the TiN film 113c is determined as appropriate and the embedded depth is not particularly limited. For example, the embedded depth ranges 5 nm (about 1/10 of the thickness) or more and 50 nm (about 9/10 of the thickness) or less. Specifically the embedded depth ranges 10 nm or more and 30 nm or less. When the embedded depth is within the above range, because the sufficient control margin of the embedded depth exists, the end portion of the opening 143c can securely be formed in the TiN film 113c, even if the etching conditions are varied in some degree.

The interaction effects of the semiconductor device according to the second embodiment will be described below.

According to the semiconductor device of the second embodiment, the semiconductor device which is excellent in the contact property between the antireflection film on the Al contained metal film and the conductive plug can be obtained with good production stability. That is, the etching adjustment film 115c formed by the insulating compound containing N or C, such as SiON, SiN, SiC, and SiCN, is provided on the antireflection film (Ti film 111c and TiN film 113c) on the Al contained metal film 109c in the semiconductor device of the second embodiment. Therefore, in the dry etching for making the opening (via), the etching rate is selectively decreased and the thickness of the etching adjustment film 115c and the etching selectivity of the etching gas are adjusted, which allows the thickness of the TiN residual film to stably be controlled.

Further, in the second embodiment, the thickness of the SiON insulating film set in the range 10 nm or more and 50 nm or less. Therefore, the overetching of the opening (via) 143c can be performed into the antireflection film of the lower layer to securely expose the antireflection film of the lower layer without halting the etching of the opening (via) 143c in the SiON insulating film.

On the other hand, in the semiconductor device having the multi-depth via, when the SiON film is caused to act as not the etching adjustment film but the etching stopper, it is necessary to halt the etching of the first step in the etching stopper (SiON film). Therefore, since it is necessary that the etching for making the opening 143c is performed in twice, the number of production processes and the process time are increased per one wafer, and the productivity and the production stability tend to be decreased.

In order to securely halt the etching in the etching stopper (SiON film), for example, it is necessary that the film thickness ranges 100 nm or more and 200 nm or less, which results in the excessive thickness of the etching adjustment film 115. When thickness of the etching adjustment film 115 becomes too big and the etching of the etching stopper is performed with the resist 141c provided on the insulating interlayer 103 as the mask, sometimes the etching time is increased to eliminate the resist 141c during the etching, or sometimes a shape of the resist 141c is changed (shoulder loss). As a result, the etching accuracy of an etching stopper (SiON film) is easily decreased.

On the contrary, in the second embodiment, the SiON film is used as the etching adjustment film 115c while the SiON film is used as the etching stopper in the conventional art. Therefore, even if the variation in thickness of the insulating interlayer 103 and the variation in etching condition are generated, at the time when the bottom surface of the opening 145e reaches the upper surface of the third conductive plug (Ti film 117e, TiN film 119e, W film 121e), the bottom surface of the opening 143c can be controlled so as to penetrate the insulating interlayer 103 and the etching adjustment film 115c to stop at a midpoint in the TiN film 113c. As a result, the Al elution is not generated in the resist stripping process using organic compound and the contact property between the conductive plug and the TiN film 113 on the Al contained metal film 109 is improved.

Third Embodiment

A semiconductor device according to a third embodiment basically has the same configuration as the semiconductor device according to the first embodiment except that an etching adjustment film 165 included in the plural multi-layer structures is formed by the continuous film.

A method of manufacturing the semiconductor device according to the third embodiment will be described below.

Figure 6A:
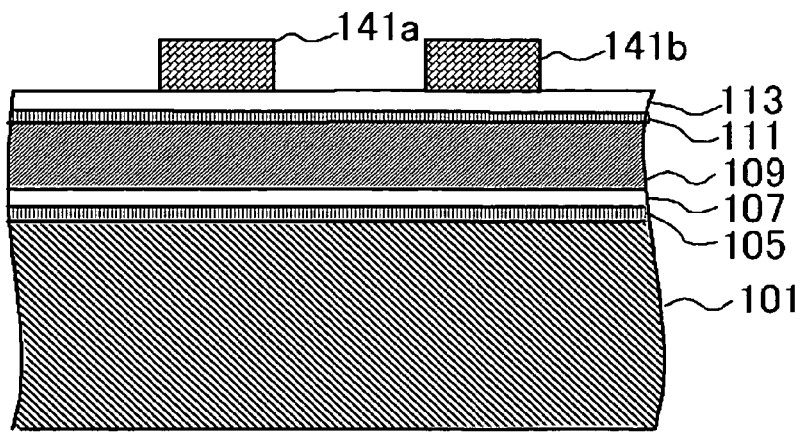
FIG. 6A is a process cross-sectional view for explaining a method of manufacturing a semiconductor device according to a third embodiment.
Figure 6B:
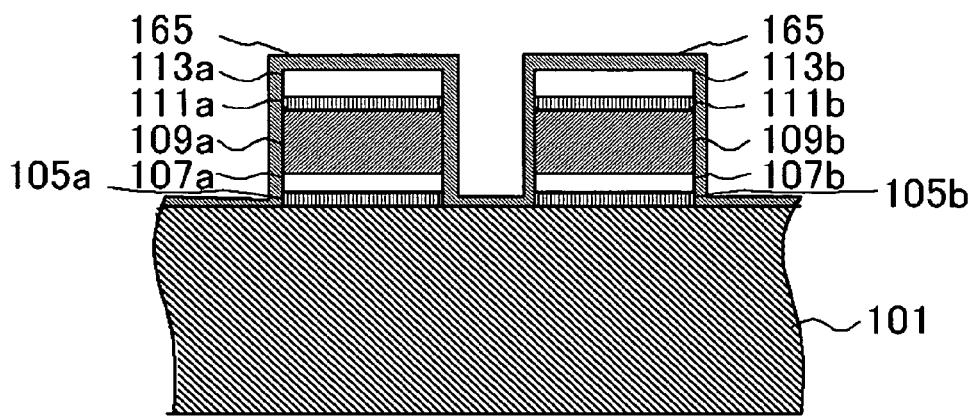
FIG. 6B is a process cross-sectional view for explaining a method of manufacturing a semiconductor device according to a third embodiment.
Figure 6C:
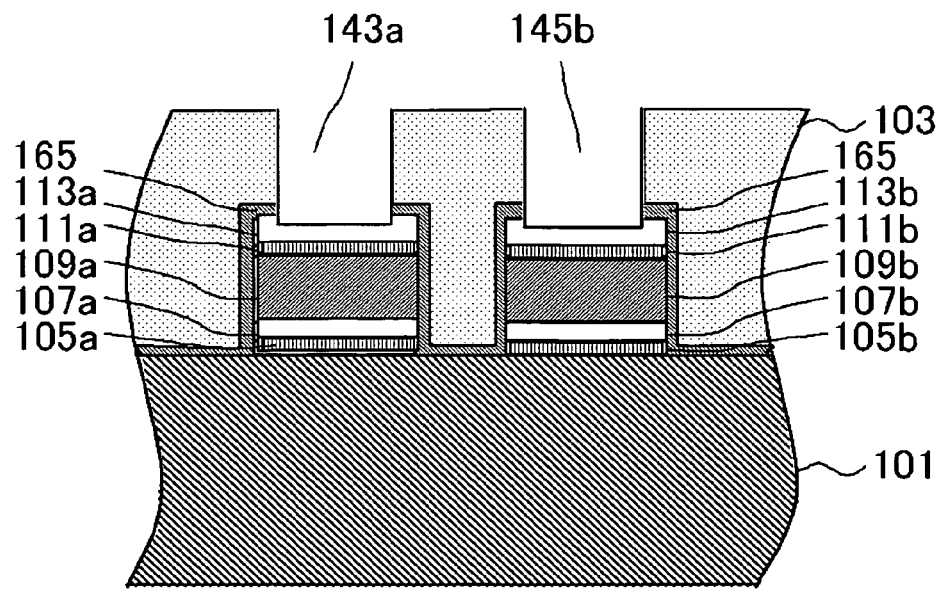
FIG. 6C is a process cross-sectional view for explaining a method of manufacturing a semiconductor device according to a third embodiment.

FIG. 6A to 6C is a process cross-sectional view schematically showing the semiconductor device manufacturing method according to the third embodiment. First the insulating interlayer 101 made of SiO$_2$ is formed in the upper portion of the semiconductor substrate (not shown). Then, the Ti film 105, the TiN film 107, the AlCu film 109, the Ti film 111, and the TiN film 113 are sequentially formed on the insulating interlayer 101. The resists 141a and 141b are formed on the TiN film 113 (FIG. 6A).

The patterning is performed to form the multi-layer structure by etching the Ti film 105, the TiN film 107, the AlCu film 109, the Ti film 111, and the TiN film 113 with the resists 141a and 141b as the mask. Then, the resists 141a and 141b are removed. The etching adjustment film 165 which is of the one SiON continuous insulating film is formed on the upper surface of the TiN film 113, the side surface of the multi-layer structure, and the upper surface of the insulating interlayer 101 (FIG. 6B).

Then, the insulating interlayer 103 is formed on the etching adjustment film 165, and the resist (not shown) is formed on the insulating interlayer 103. The insulating interlayer 103, the etching adjustment film 165, and the TiN films 113a and 113b are etched to form the openings 143a and 145b by using the resist as the mask (FIG. 6C). At this point, the leading end portions of the openings 143a and 145b are adjusted so as to stop at midpoints in the TiN films 113a and 113b respectively.

The argon plasma treatment is performed to the insides of the openings 143a and 145b to remove etching residues, and the barrier metal films (not shown) are formed by the sputtering. The tungsten films (not shown) are formed on the barrier metal films by the CVD method. Then, the excessive barrier films and tungsten films, which are located on the insulating interlayer 103, are removed and planarized by CMP (Chemical Mechanical Polishing) (no shown).

The interaction effects of the semiconductor device according to the third embodiment will be described below.

The interaction effects of the semiconductor device according to the third embodiment are basically similar to those of the semiconductor device according to the first embodiment except for the following interaction effects. That is, according to the third embodiment, when the widths of the openings 143a and 145b are substantially equal to the widths of the Al contained metal films 109a and 109b respectively, an etching width margin is increased, so that the dimensions of the bottom portions of the openings 143a and 145b can be enlarged. Further, the exposure of the side surfaces of the Al contained metal films 109a and 109b can be prevented in the openings 143a and 145b. When the Al sidewall is exposed, there is a risk that aluminum is eluted during the stripping process using organic compound.

Thus, the embodiments of the invention are described with reference to the accompanying drawings. These embodiments are illustrative only, and various configurations may be adopted.

For example, in the embodiments, the etching is performed such that the bottom surface of the opening 143 is stopped at a midpoint in the TiN film 113. However, the etching may be performed such that the bottom surface of the opening 143 is stopped at a midpoint in the Ti film 111. In this case, the Al elution can also be suppressed during the resist stripping process using organic compound. In this case, it is preferable to sufficiently ensure the thickness of the Ti film 111. This is because the bottom surface of the opening 143 is prevented from penetrating the Ti film 111.

It is apparent that the present invention is not limited to the above embodiment, that may be modified and changed without departing from the scope and spirit of the invention.

What is claimed is:
1. A semiconductor device, comprising:
a semiconductor substrate;
a multilayer structure in an upper portion of said semiconductor substrate, in which an aluminum contained metal film, an antireflection film, and an etching adjustment film are sequentially stacked;

an insulating interlayer on said multilayer structure; and a conductive plug, which penetrates said insulating interlayer and said etching adjustment film, wherein an end surface of the conductive plug contacts and is embedded in a TiN layer of said antireflection film, wherein said etching adjustment film is formed from SiON whose etching rate is slower than that of the insulating interlayer and is higher than that of TiN to an etching gas which includes a fluorocarbon compound expressed by a general formula of $C_xF_y$ (X is a real number of 4 or more and Y is a positive real number), said etching adjustment film is configured to delay an etching rate, and an etching selectivity between the insulating interlayer and the etching adjustment film is about 15.

2. The semiconductor device according to claim 1, wherein a depth from an upper surface of said antireflection film to the end face of said conductive plug ranges 1/10 or more and 9/10 or less of a film thickness of said antireflection film.

3. The semiconductor device according to claim 1, wherein a plurality of said multilayer structures are provided in a same level, and the plurality of said etching adjustment film included in the plurality of said multilayer structures are composed of the film formed in the same process.

4. The semiconductor device according to claim 1, wherein said etching adjustment film is provided on a side surface of said aluminum contained metal film and a side surface of said antireflection film.

5. The semiconductor device according to claim 1, further comprising a second conductive plug, which is formed through the same process as said conductive plug in said insulating interlayer, wherein said conductive plug and said second conductive plug differ from each other in a length.

6. The semiconductor device according to claim 1, wherein said antireflection layer comprises a bilayer.

7. The semiconductor device according to claim 6, wherein said bilayer comprises the TiN layer over a Ti layer.

8. The semiconductor device according to claim 1, wherein said conductive plug comprises a Ti film, a TiN film and a W film.

9. The semiconductor device according to claim 1, wherein said aluminum contained metal film comprises an AlCu film.

10. The semiconductor device according to claim 1, further comprising an adhesive film between said semiconductor substrate and said multilayer structure.

11. The semiconductor device according to claim 10, wherein said adhesive film comprises a TiN film over a Ti film.

12. The semiconductor device according to claim 1, wherein said etching adjustment film comprises a material which is selected from the group consisting of SiN, SiC and SiCN.

13. The semiconductor device according to claim 1, wherein said etching adjustment film thickness is from 10 to 50 nm and said TiN layer thickness is from 10 to 200 nm.

14. A method of manufacturing semiconductor device comprising:

forming a multilayer structure in which an aluminum contained metal film, an antireflection film, and an etching adjustment film are sequentially stacked;

forming an insulating interlayer on said multilayer structure;

making an opening, which penetrates said insulating interlayer and said etching adjustment film, an end portion of the opening being located in said antireflection film by etching said insulating interlayer, said etching adjustment film, and said antireflection film with the same etching gas; and forming a conductive plug whose end surface is embedded in a TiN layer of said antireflection film by forming an electrically conductive film in said opening, wherein said etching adjustment film is formed from SiON whose etching rate is slower than that of the insulating interlayer and is higher than that of TiN to an etching gas which includes a fluorocarbon compound expressed by a general formula of $C_xF_y$ (X is a real number of 4 or more and Y is a positive real number), said etching adjustment film is configured to delay an etching rate, and an etching selectivity between the insulating interlayer and the etching adjustment film is about 15.

15. The method of manufacturing semiconductor device according to claim 14, wherein the step of forming said etching adjustment film includes a step of forming a SiON film.

16. The method of manufacturing semiconductor device according to claim 14, wherein the step of forming said multilayer structure includes a step of providing said etching adjustment film on a side surface of said aluminum contained metal film, an upper surface and a side surface of said antireflection film.

17. The method of manufacturing semiconductor device according to claim 14, further comprising:

forming a second opening which is different from said opening in a depth in the insulating interlayer by etching in the same step of making said opening, and forming the second conductive plug which is different from said conductive plug in a length in said second opening.

18. The method of manufacturing semiconductor device according to claim 14, wherein said antireflection layer comprises a bilayer.

19. The method of manufacturing semiconductor device according to claim 18, wherein said bilayer comprises the TiN layer over a Ti layer.

20. The method of manufacturing semiconductor device according to claim 14, wherein said conductive plug comprises a Ti film, a TiN film and a W film.

* * * * *